United States Patent [19]

Prost et al.

[11] Patent Number: 5,051,802
[45] Date of Patent: Sep. 24, 1991

[54] COMPACT IMAGE SENSOR

[75] Inventors: Roger Prost; Jean Chabbal, both of St. Egreve, France

[73] Assignee: Thomson-CSF, Paris, France

[21] Appl. No.: 563,826

[22] Filed: Aug. 6, 1990

Related U.S. Application Data

[63] Continuation of Ser. No. 298,903, Jan. 19, 1989, abandoned.

[30] Foreign Application Priority Data

Jan. 22, 1988 [FR] France .................. 88 00679

[51] Int. Cl.⁵ .................. H01L 27/14; H01L 23/28; H01L 23/02
[52] U.S. Cl. .................. 357/30; 357/72; 357/74
[58] Field of Search .................. 357/30 D, 30 K, 30 L, 357/30 M, 30 Q, 74, 74 A, 74 B, 74 C

[56] References Cited

U.S. PATENT DOCUMENTS 3,456,159  7/1969  Davis et al. .................. 357/74

FOREIGN PATENT DOCUMENTS

| 2565408 | 6/1985 | France | 357/30 |
|---|---|---|---|
| 0040870 | 3/1983 | Japan | 357/30 |
| 0107788 | 6/1983 | Japan | 257/30 |
| 0047774 | 3/1984 | Japan | 357/74 |
| 0096751 | 6/1984 | Japan | 357/74 |

OTHER PUBLICATIONS

Patents Abstracts of Japan, vol. 7, No. 123 (E-178)[1268], May 27, 1983.
Patent Abstracts of Japan, vol. 8, No. 139 (E-253)[1576], Jun. 28, 1984.
Patent Abstracts of Japan, vol. 7, No. 214 (E-199)[1359], Sep. 21, 1983.

Primary Examiner—Rolf Hille
Assistant Examiner—Wael Fahmy
Attorney, Agent, or Firm—Oblon, Spivak, McClelland, Maier & Neustadt

[57] ABSTRACT

A compact image sensor is disclosed. This sensor comprises an insulating, imperviously sealed package, provided with a window which is transparent to light rays and is located on a front face. The inside of the package contains a stack arrangement which comprises, between the back of the package and the window, an insulating support, a set of photosensitive elements with a semiconducting substrate, surrounded by contacts. Connection terminals go through the back of the package and the insulating support. Connection means are interposed between these contacts and the ends of the terminals. The light rays are received by the photosensitive elements after they have crossed the semiconducting substrate which is thinned down beforehand. This arrangement of the photosensitive elements, the substrate and the connection means enables an appreciable increase in the area of the photosensitive surface and in the number of connection terminals, without an increase in the area of the front surface of the sensor.

7 Claims, 3 Drawing Sheets

COMPACT IMAGE SENSOR

This application is a continuation of application Ser. No. 07/298,903, filed on Jan. 19, 1989, now abandoned.

BACKGROUND OF THE INVENTION

1. Field of the Invention

The present invention concerns a compact image sensor. This sensor can be applied notably in endoscopy. In this application, it is clearly necessary for the sensor to occupy as little space as possible while, at the same time, preserving acceptable electro-optical performance characteristics with regard to photosensitive surface, resolution, sensitivity, etc.

2. Description of the Prior Art

FIGS. 1 and 2 give a schematic view of a compact image sensor of the prior art. FIG. 1 shows a schematic cross-section of this sensor and FIG. 2 shows a schematic section along AA of the sensor of FIG. 1. The same references are repeated for the same elements in FIGS. 1 and 2.

This sensor has an imperviously sealed package 1, made of an electrically insulating material, for example a molded plastic material. This package has a front face 2, with a window 3, made of an electrically insulating material, which is transparent to light rays R coming from a part of an organ of the human body or from an object for which it is sought to obtain an image. The material forming the window 3 is made, for example, of glass or of a transparent plastic material. It is clear that when this sensor is used to obtain images of the inside of a human organ, the inside of this organ is illuminated by a light source which is independent of the sensor.

This sensor also has a rear face 4, forming the back of the package 1. This rear face is parallel to the front face.

Between the back 4 and the window 3, the inside of the package contains a stack arrangement comprising an insulating support 5, formed, for example, by a ceramic, and a set 6 of photosensitive elements on a semiconducting substrate 7, shown in a non-detailed way in the figure.

This substrate may be, for example, silicon while the photosensitive elements form a matrix consisting of photodiodes which may possibly be associated with charge-coupled devices or (CCDs).

As shown more precisely in FIG. 2, the photosensitive elements form a surface S bounded by a periphery P having contact elements or contacts such as 8. These contacts are connected to the photosensitive elements of the set 6, for example by connection tracks such as 9.

This sensor also has connection means used to connect the contacts 8 with connection terminals 10. These connection terminals go through the back 4 of the package 1. Herein, for each contact 8 and each corresponding terminal 10, there s a conducting strap 11 and an intermediate conducting part 12. The conducting strap 11 is metallic and flexible: it is made of copper for example. This strap is in contact with the contact element 8 and with the intermediate part 12, which itself is in contact with the terminal 10. This intermediate part too may be made of copper. Electrical conduction is thus set up between the terminal 10 and the contact 8. The various terminals of the sensor provide for the electrical supply to the photosensitive elements corresponding to the different contacts. The terminals 10 also enable the collection of the electrical signals given by the photosensitive elements when the photosensitive surface S is illuminated by light rays R. The electrical contacts between each contact element 8, strap 11, intermediate part 12 and terminal 10 are provided through the mechanical pressure that the package exerts, as it is being molded, on the window 3.

In this type of sensor, the area of the photosensitive surface S amounts to less than half of that of the front surface of the package 1, bounded by its external rim F. In a package with a front surface area of 16 mm$^2$ for example, the photosensitive surface S occupies only 43% of this front surface. The remaining part is occupied, to a great extent, by all the connection elements (straps 11, intermediate parts 12) connecting the contacts 8 to the corresponding terminals 10. In the example considered, for a package with a front surface area of 16 mm$^2$, the number of terminals 10 is restricted to six, and it is impossible to increase this number without increasing the front surface area of the sensor, precisely because of the excessive amount of space that the connection elements take up in the package. It is undesirable to increase the front surface area, especially for endoscopy. The result of this is that, in the prior art, there is no known sensor which, for the type of structure described, and for one and the same front surface area, has a photosensitive surface with a far greater area and with more connection terminals. This is a major drawback, because the performance characteristics of this sensor are limited.

The invention is aimed precisely at overcoming these drawbacks by making a compact image sensor wherein, without increasing the area of the front surface, it is possible to very substantially increase the area of the photosensitive surface as well as the number of connection terminals. These aims are achieved, as shall be seen further below in detail, by means of a judicious stacking arrangement within the package and through the use of far more compact connection elements.

SUMMARY OF THE INVENTION

It is an object of the invention provide a compact image sensor, comprising an imperviously sealed package made of an electrically insulating material, said package having a front face provided with a window made of an electrically insulating material which is transparent to light rays, and a rear face forming the back of the package, said sensor further having, in this package, a stack arrangement comprising, between the back of the package and the window, an insulating support, a set of photosensitive elements with a semiconducting substrate, said photosensitive elements forming a photosensitive surface bounded by a periphery, comprising contacts for connection with the photosensitive elements and connection means to connect the contacts with connection terminals, enabling electrical supply to the photosensitive elements and enabling the collection of electrical signals given by these elements when they are illuminated, said connection elements going through the back of the package, wherein the semiconducting substrate is located so as to face the window, the photosensitive elements being located so as to face the insulating support and receiving the light rays that have gone through the window and the substrate, the connection terminals going through the insulating support and coming out, by respective ends, on to a face of this support that faces the photosensitive surface and the contacts, the connection means being interposed between said ends of the terminals and the corresponding contacts.

According to another characteristic of the invention, the connection means comprise spacers made of an electrically conductive material, respectively interposed between the ends of the terminals and the corresponding contacts, these spacers being in contact with these ends and these terminals.

According to another characteristic, these spacers are indium balls.

According to another characteristic, said spacers are formed by a conductive bonder According to another characteristic, the connection means have an insulating sheet with zones of conductive material, respectively located so as to face said contacts and the corresponding ends of said terminals.

According to another characteristic, said conducting material is a metal.

BRIEF DESCRIPTION OF THE DRAWINGS

The characteristics and advantages of the invention will emerge more clearly from the following description, given with reference to the appended drawings, of which.

DESCRIPTION OF PREFERRED EMBODIMENTS

Figure 3:
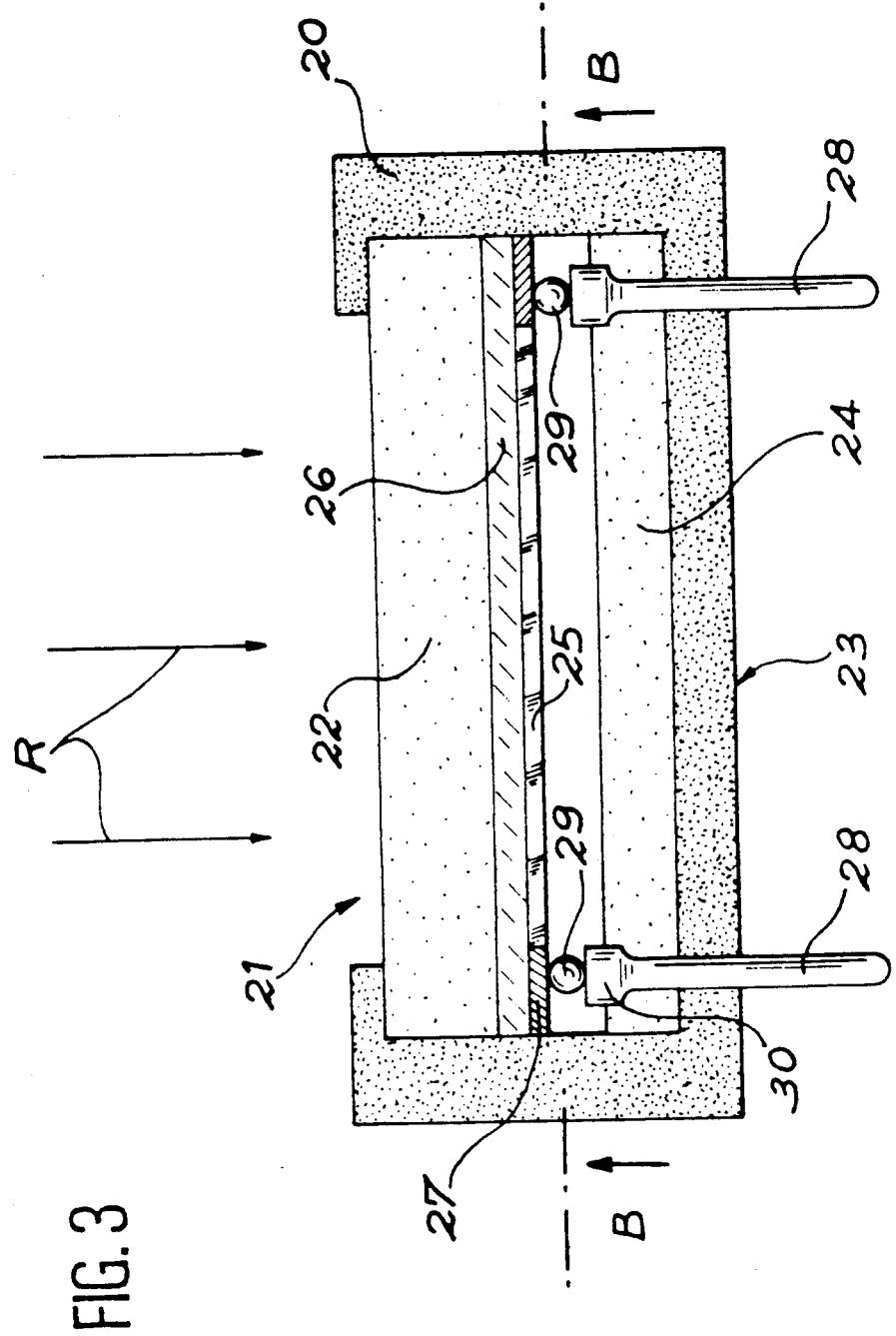
FIG. 3 shows a schematic, cross-section view of a sensor according to the invention.

The sensor according to the invention, shown schematically in a cross-section in FIG. 3, comprises a sealed package 20, made of an electrically insulating material, for example a plastic material. This package has a front face 21, provided with a window 22, made of an electrically insulating and transparent material, such as a plastic material or glass. The imperviousness between the package 20 and the window 22 is provided by suitable means such as bonding for example. The window 22 receives light rays R, coming from a part of the inside of an object or an organ of the human body. A rear face 23 of this package, parallel to the window 22, forms the back of the package.

The inside of the package contains, between the back 23 and the window 22, a stack arrangement which comprises an insulating support 24, made of ceramic for example, and a set of photosensitive elements 25 with a semiconducting substrate 26.

Figure 4:
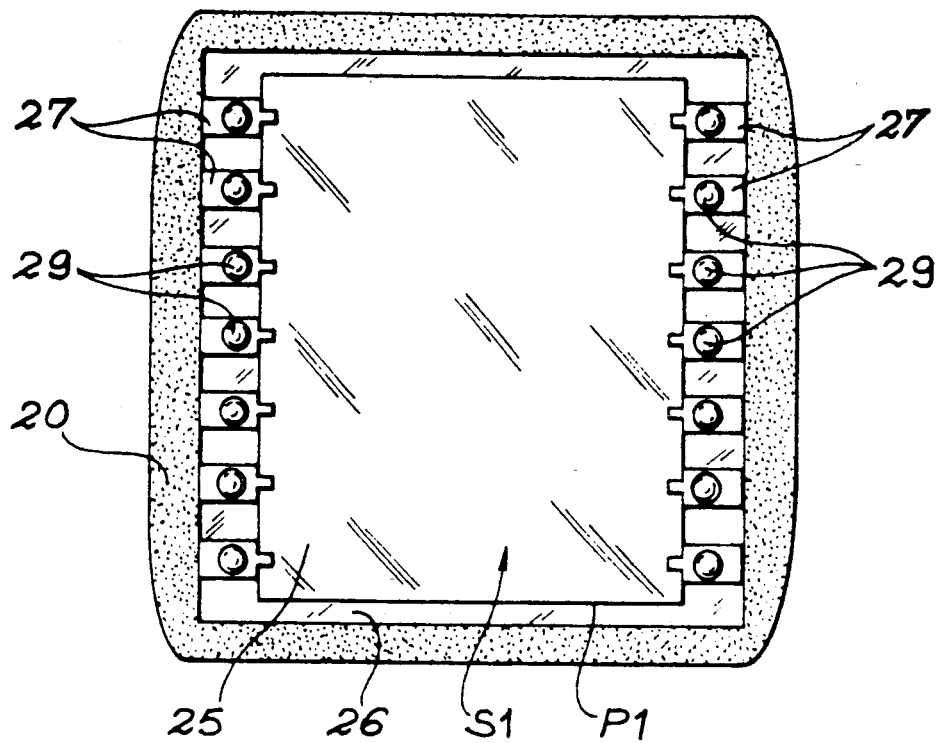
FIG. 4 shows a schematic sectional view along BB of the sensor of FIG. 3.

The photosensitive elements form a photosensitive surface S1, which can be seen more clearly in the section BB of FIG. 4. This surface is bounded by a periphery P1 having contacts such as 27 for connection with the photosensitive elements 25. These elements are not shown in detail. They may consist of photodiodes, possibly associated with charge-coupled devices (CCDs) forming a photosensitive matrix of the surface S1.

This sensor also has connection means to connect the contacts 27 with connection terminals 28, enabling electrical supply to the photosensitive elements and enabling the collection of the electrical signals given by these elements when they are illuminated by the light rays R, coming from inside the object or organ for which it is sought to obtain an image. Of course, this picture is obtained by processing the signals collected at the terminals 28. The connections 28 go through the back 23 of the package 20 and, according to the invention, also go through the insulating support 24. Each end 30 of each terminal emerges from the insulating support and reaches that face of this support which faces the photosensitive elements 25 and the contacts 27.

Figure 1:
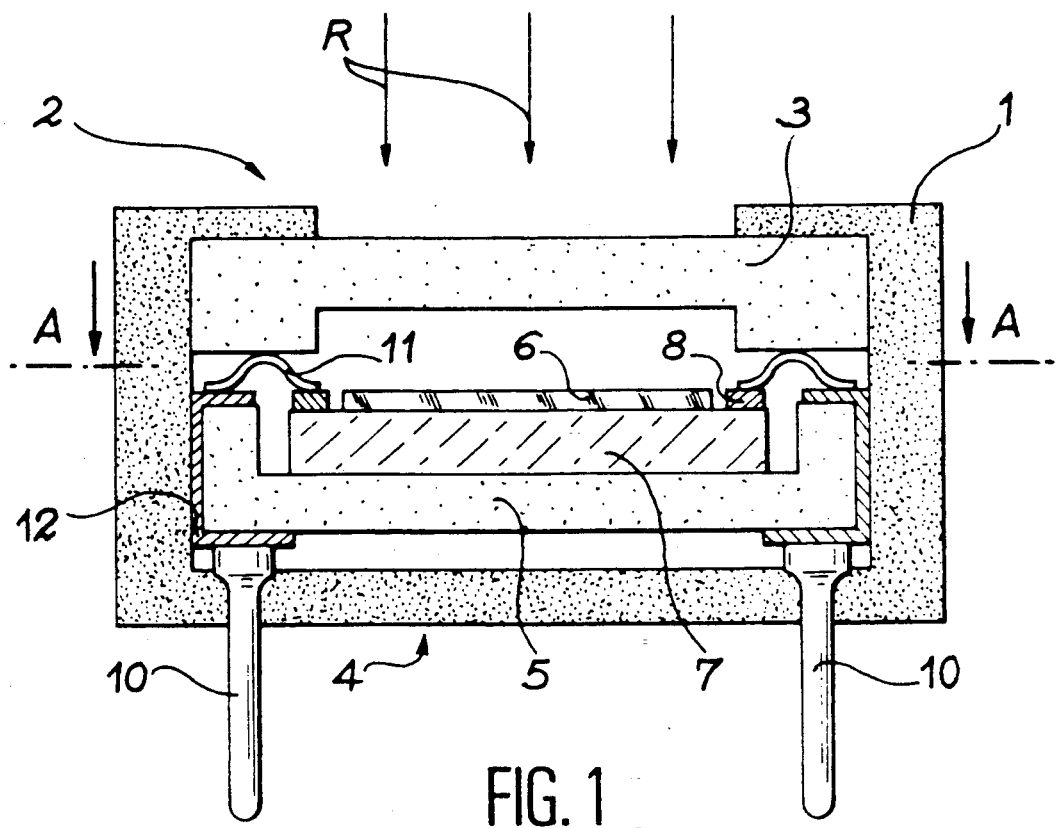
FIG. 1, which has already been described, shows a schematic, cross-section view of a prior art sensor.
Figure 2:
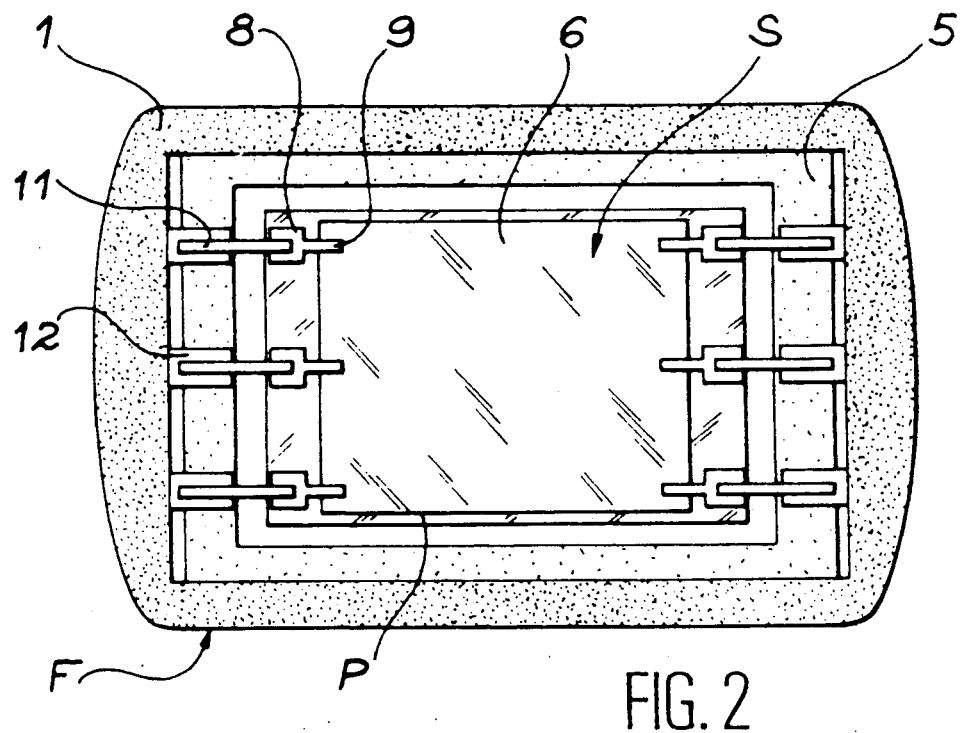
FIG. 2, which has already been described, shows a schematic view of the sensor of FIG. 1 along the section AA.

According to the invention, the semiconducting substrate 26 (made of silicon for example) is placed facing the window 22 while the photosensitive elements are placed facing the insulating support 24. In the above-described, prior art type of sensor, a reverse arrangement is chosen as can be seen in FIG. 1. The semiconducting substrate 7 is facing the insulating support 5 while the photosensitive elements 6 are facing the window 3. The result thereof is that, in the prior art sensor, the light rays R are directly received by the photosensitive elements 6 after they have gone through the window 3. By contrast, in the sensor of the invention (FIGS. 3 and 4), the light rays R are received by the photosensitive elements 25, after they have crossed the window 22 and the semiconducting substrate 26, obtained by thinning down the standard semiconducting substrate which, herein, has a thickness which is far smaller than that of the known sensor (10 to 15 microns instead of several tens of microns). It is precisely this reverse arrangement that makes it possible to very greatly increase the area of the photosensitive surface within the package as can be seen in FIG. 4. For, the contacts 27 are located so that they face the back of the package and the corresponding connection terminals 28. This makes it possible, as shall be seen further below in detail, to reduce the space occupied by the connection means used to connect these contacts and these terminals respectively.

The connection means are, herein, respectively interposed between these contacts 27 and the terminals 28 which correspond to them.

In a first embodiment of the sensor of the invention, as shown in FIGS. 3 and 4, these connection means comprise spacers 29 made of a conductive material These spacers are respectively interposed between the contacts 27 and the ends 30 of the corresponding terminals 28. Each spacer is in contact with the end 30 of the corresponding terminal 28, owing to the mechanical pressure exerted by the package on the window 22 which itself rests on the substrate 26. These spacers may be formed, in this embodiment, by indium balls obtained by growth under vacuum on the contacts 27. When the package is molded around the stack arrangement, these balls are slightly crushed owing to the mechanical pressure exerted by the package on the window, and good electrical contact is thus provided between these balls and the ends 30 of the terminals 28.

These spacers may also be formed by a conductive bonder, such as an epoxy resin containing silver for example.

Figure 5:
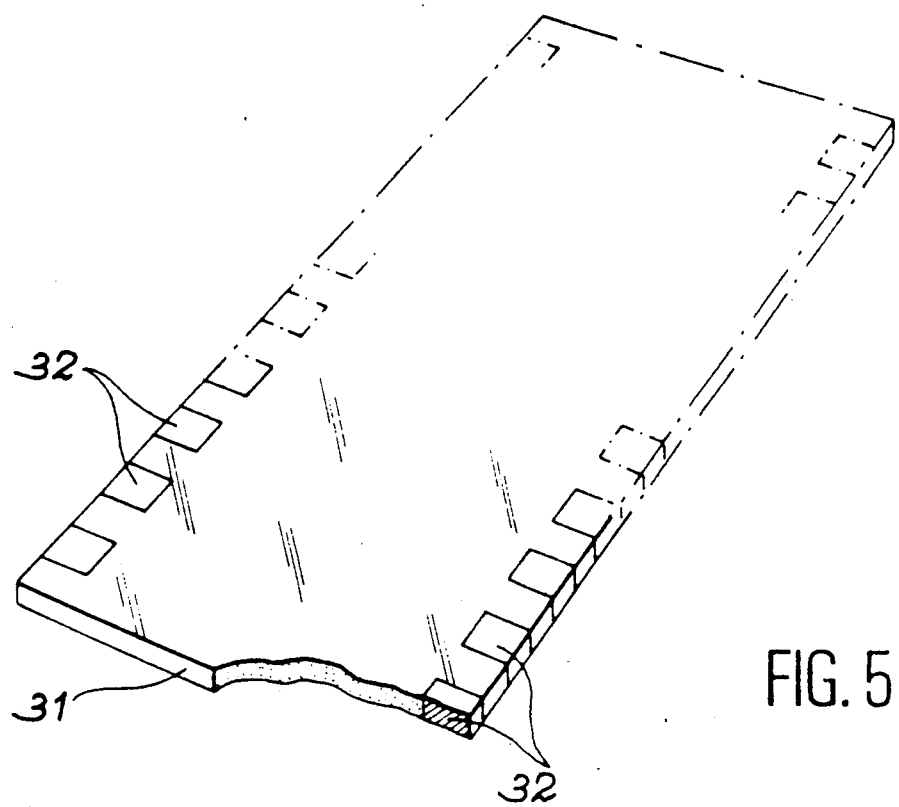
FIG. 5 shows a schematic view, in perspective, of one of the connection means used in the sensor of the invention.

FIG. 5 gives a schematic view, in perspective, of another embodiment of the connection means interposed between the contacts 27 and the ends 30 of the terminals 28. In this embodiment, these connection means are formed by an insulating sheet 31 which has zones 32 of a conducting material. These zones are respectively located so that they face contacts 27 and the ends 30 of the corresponding terminals 28. The conducting zones are metallic (made of copper for example). The insulating sheet 31 may be made of an elastomer material. During the assembly of the sensor, this insulating sheet 31 is interposed between the set of photosensitive elements 25 and the ends 30 of the terminals 28. The pressure exerted by the package on the window 22 provides for good contact among the conducting zones 32, the ends 30 of the terminals 28 and the contacts 27. By means of the structure which has just been described, the area of the surface S1 of the set of photosensitive elements can be at least two times smaller than the area of the surface S of these elements in the prior art sensor. The same is true for the number of connection terminals which is far greater than in the prior art sensor. These goals are achieved without modifying the frontal surface of the sensor.

What is claimed is:

1. A compact arrayed image sensor, comprising:
    an imperviously sealed package made of an electrically insulating material, said package having a front face provided with a transparent window;
    an insulating support interposed between said front and rear face;
    an array of photosensitive elements on a monocrystalline semiconductor substrate, wherein said semiconductor substrate is interposed between said window and said insulating support, said semiconductor substrate facing said window, and said array of photosensitive elements facing said insulating support, oriented such that said photosensitive elements receive light rays that have gone through the window and through the substrate;
    electrical contacts for connection with said photosensitive elements, said contacts being located on said semiconductor substrate;
    connection terminals which go through the insulating support and through the rear face of the package, said connection terminals having respective ends, an internal end located on the inside, and an external end located on the outside of said impervious package.

2. An image sensor according to claim 1, wherein the connection means comprise spacers made of an electrically conductive material, respectively interposed between the ends of the terminals and the corresponding contacts, these spacers being in contact with these ends and these terminals.

3. A sensor according to claim 1, wherein said spacers are indium balls.

4. A sensor according to claim 1, wherein said spacers are formed by a conductive bonder.

5. A sensor according to claim 1, wherein the connection means comprise an insulating sheet including zones of conductive material, respectively located so as to face said contacts and the corresponding ends of said terminals.

6. A sensor according to claim 5, wherein said conducting material is a metal.

7. A compact arrayed image sensor comprising an imperviously sealed package, said package having a rear face, and a front face provided with a transparent window; and
    array of photosensitive elements on a monocrystalline semiconductor substrate wherein said substrate being at least partially transparent to the light radiation to be directed, said semiconductor substrate facing said window and said array facing said rear face such that light radiation to be detected passes through said substrate, said semiconductor substrate provided with contact pads for electrical connection with said photosensitive elements; said sensor further comprising connecting pins in electrical contact with said contact pads, said pins projecting through the rear face of the package.

* * * * *